United States Patent

Emmerich

[11] Patent Number: 5,889,659
[45] Date of Patent: Mar. 30, 1999

[54] SYSTEM FOR ESTIMATING A LOAD TO OPTIMIZE A BACKUP ENERGY SYSTEM RESPONSE

[75] Inventor: Jeffery E. Emmerich, Madison, Wis.

[73] Assignee: Superconductivity, Inc., Middleton, Wis.

[21] Appl. No.: 851,478

[22] Filed: May 5, 1997

Related U.S. Application Data

[60] Provisional application No. 60/016,943 May 6, 1996.

[51] Int. Cl.$^6$ ................................................ H02M 5/40
[52] U.S. Cl. .............................. 363/34; 363/37; 363/95; 307/66
[58] Field of Search .................... 307/64, 66; 363/34, 363/35, 37, 95

[56] References Cited

U.S. PATENT DOCUMENTS

| | | | |
|---|---|---|---|
| 4,707,774 | 11/1987 | Kajita | 363/37 |
| 4,709,318 | 11/1987 | Gephart et al. | 363/37 |
| 4,719,550 | 1/1988 | Powell et al. | 307/66 |
| 5,204,548 | 4/1993 | Dahler et al. | 307/66 |
| 5,315,533 | 5/1994 | Stich et al. | 364/480 |
| 5,602,462 | 2/1997 | Stich et al. | 323/258 |

*Primary Examiner*—Jeffrey Sterrett
*Attorney, Agent, or Firm*—McAndrews, Held & Malloy, Ltd.

[57] ABSTRACT

A method of delivering an optimized power level from a backup energy system to a load connected to a primary energy supply via a DC link and an inverter is provided. The method has the steps of: sensing a voltage of the DC link connected to the load; connecting a converter between the backup energy supply and the DC link; evaluating a rate of change of the voltage of the DC link; determining an estimate of the average load current using the rate of change of the DC link voltage; and controlling the converter using the average load current to switch the optimized power output from the backup energy supply to the load. In an embodiment, the step of determining an estimate of the average load current using the rate of change of the DC link voltage is performed in accordance with a formula $I_{load} = C_{DC\ link}(dV_{DC\ link}/dt)$. Also, the step of evaluating a rate of change of the DC link voltage is performed by representing a plurality of DC link voltage samples taken over time as points in an x-y coordinate system connected by a best fit line such that the slope of the line represents the rate of change of the voltage of the DC link. Further, the step of evaluating the rate of change of the DC link voltage may be implemented using a first plurality of serially connected sample and hold amplifiers having a second plurality of difference amplifiers selectively connected to the first plurality of sample and hold amplifiers and an operational amplifier summer connected to sum outputs of the difference amplifiers to produce an output. The output is used to control the converter for an optimized power level output switchover.

16 Claims, 4 Drawing Sheets

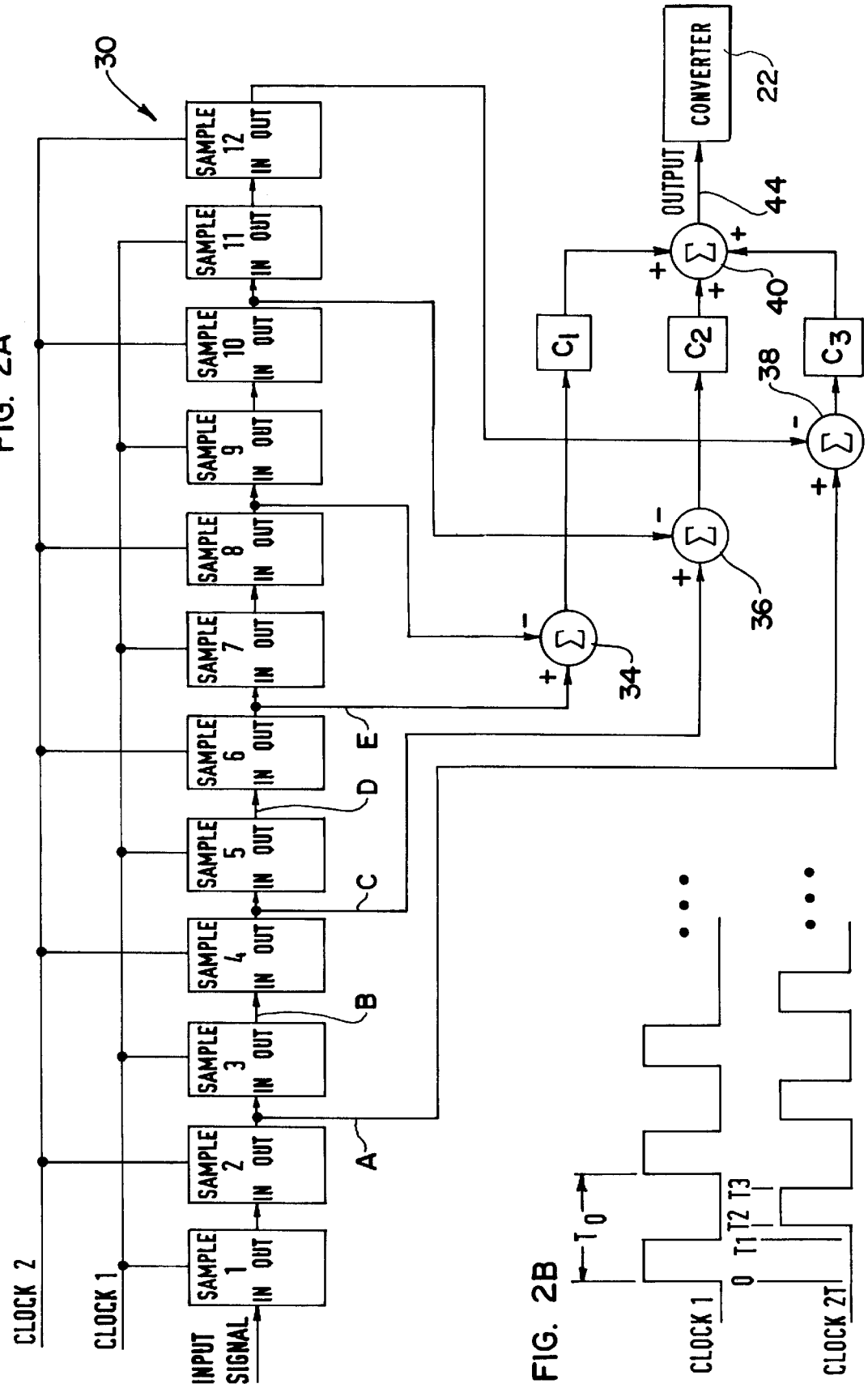

SYSTEM FOR ESTIMATING A LOAD TO OPTIMIZE A BACKUP ENERGY SYSTEM RESPONSE

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract Nos. FO-4606-89-D-0036 and FO-4606-95-C-0293 awarded by the Department of Defense, Department of the Air Force.

CROSS-REFERENCE TO RELATED APPLICATIONS

This application claims priority of provisional application, Ser. No. 60/016,943, filed May 6, 1996.

BACKGROUND OF THE INVENTION

The present invention relates generally to estimating a load and more particularly to a method for load estimation using only DC link voltage measurements to determine an average load current which is used as an initial condition for optimally controlling a converter connected between a backup DC energy source and a customer load.

Known inverter systems (i.e., commercially available motor drives and uninterruptable power supply (UPS) systems, etc.) experience problems due to utility power outages and sags in power. Normally, the DC link of the inverter system is supported by the utility via a rectifier. When the utility fails, the DC link voltage falls as the inverter continues to draw from it. The voltage quickly falls to a level insufficient to support the inverter, and the system subsequently trips off line.

In certain situations, a backup energy source delivers supplemental energy to stop the fall of the DC link and hold it at a potential above the trip point. Energy is provided through a power converter which is typically waiting in a standby mode until the DC link falls. This converter must assume the entire load as quickly as possible so as to prevent the further collapse of the DC link voltage.

Most applications of such a backup energy source do not provide for or allow the use of any in-line instrumentation to measure the load current. Typical ways of measuring the load current to determine the load include inserting a meter in series to measure the load current. However, often times the situation is such that the customer load is inaccessible or it is undesirable to open a line and insert such a measurement device. A system for estimating a load to optimize a power switchover is therefore needed which augments and supplements the customer's system without invasively violating it.

BRIEF SUMMARY OF THE INVENTION

To this end, a system and method for a load estimation using only DC link voltage measurements is provided. The method provides a non-intrusive estimation of a load that a converter is about to assume by looking at only DC link voltage information. It is an advantage of the present invention to provide a method for estimating the load to be assumed by a converter that allows converter switching to commence at a level optimized to the anticipated load. This advantage minimizes any voltage undershoot as the converter picks up the load.

It is another advantage of the present invention to provide a method for estimating a load using only DC link voltage measurements that is non-intrusive to a customer system.

It is a further advantage of the method of the present invention to set an initial condition so that when the converter starts running, the converter knows how much load is going to be on it based upon the DC link voltage measurements.

These and other advantages may be accomplished in an embodiment of the method of delivering an optimized output power level from a backup energy system to a load connected to a primary energy supply via a DC link and an inverter. The method has the steps of: sensing a voltage of the DC link; connecting a converter between the backup energy supply and the DC link; evaluating a rate of change of the voltage of the DC link; determining an estimate of the average load current representing an optimized load using the rate of change of the DC link voltage; and controlling the converter using the average load current to deliver an optimized power output level from the backup energy supply to the load.

In an embodiment, the step of determining an estimate of the average load current using the rate of change of the DC link voltage is performed in accordance with a formula $I_{load} = C_{DC\ link}(dV_{Dc\ link}/dt)$, where $C_{DC\ link}$ is the capacitance of the DC link. Typically, the DC link is embodied as a capacitor bank. Also, the step of evaluating a rate of change of the DC link voltage is performed by representing a plurality of DC link voltage samples taken over time as points in an x-y coordinate system connected by a best fit line such that the slope of the line represents the rate of change of the voltage of the DC link.

Further, the step of evaluating the rate of change of the DC link voltage may be implemented using a first plurality of serially connected sample and hold amplifiers having a second plurality of difference amplifiers selectively connected to the first plurality of sample and hold amplifiers and an operational amplifier summer connected to sum outputs of the difference amplifiers to produce an output. The output is used to control the converter for an optimized power switchover.

The method of the present invention provides an estimate of the load about to be assumed by the converter based upon the rate of change of the voltage of the DC link. This rate of change of the DC link voltage may be estimated by observing a slope of the voltage rate of change. This slope may be determined using a curve fitting algorithm as described below. Further, such a curve-fitting algorithm can be represented and implemented by a finite impulse response (FIR) filter. Such a FIR filter is easily implemented using analog circuitry as also discussed below. Thus, the switchover from utility power during an outage or sag to an energy storage source via a converter, which is operated by initial conditions set by the rate of change of the DC link voltage, is provided. A smooth transition thereby results during the switch from the utility to the backup energy source. The load is closely estimated to the consumer load so that no further drop occurs during the switchover. The load estimation provides better control of the system since the initial condition of the converter is nearly equal to the load to be assumed.

BRIEF DESCRIPTION OF THE SEVERAL VIEWS OF THE DRAWINGS

FIGS. 2A and 2B together show an embodiment of a six sample load estimator for use in accordance with an embodiment of the method of the present invention.

DETAILED DESCRIPTION OF THE INVENTION

The present invention provides a backup DC energy system which protects inverter systems (i.e., motor drives, UPS'S, etc.) against utility power outages and sags. Normally, the DC link of the inverter system is supported by the utility via a rectifier. When the utility fails, the DC link voltage falls as the inverter continues to draw from it. The voltage will quickly fall to a level insufficient to support the inverter, and the system will trip off line.

A non-invasive method for load estimation using only DC link voltage measurements to optimize switching from utility power to the backup DC energy source is provided. A converter having a load estimator, which is part of the backup energy system, senses the fallen DC link voltage and delivers supplemental energy to stop the fall of the DC link voltage and hold it at a potential well above the trip point. Energy is thus provided through the power converter which waits in a standby mode until the DC link falls a predetermined amount. This predetermined amount is provided to differentiate between real and false voltage drops thereby ensuring proper switchover operation.

In addition, the converter must assume the entire load as quickly as possible so as to prevent the further collapse of the DC link voltage. Therefore, a priori knowledge of the load that the converter is about to assume allows converter switching to begin at a level optimized to the load. Such operation minimizes voltage undershoot as the converter picks up the load.

Figure 1:
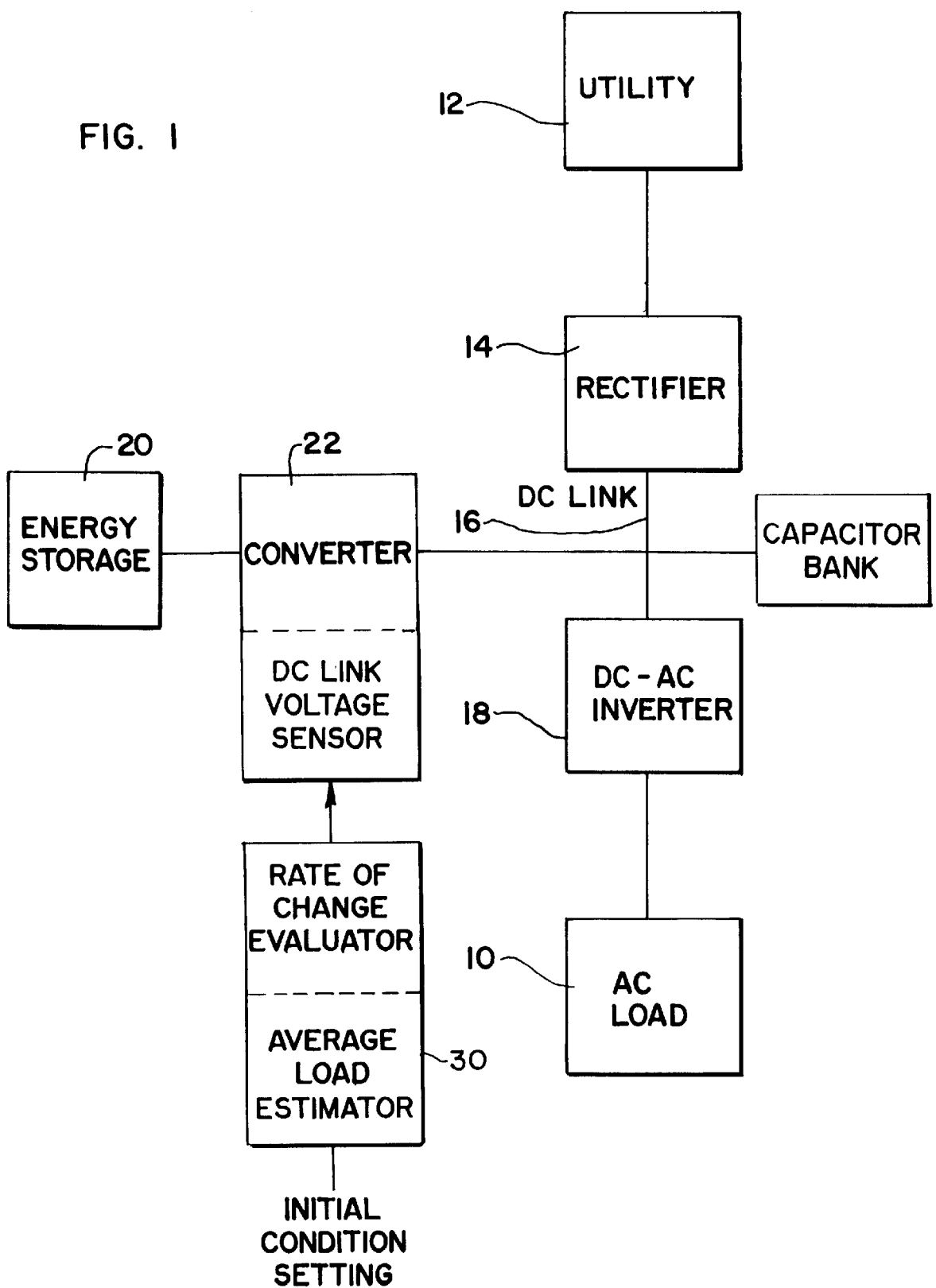
FIG. 1 is a block diagram illustrating interconnection of system components for use in accordance with an embodiment of the method of the present invention.

Turning now to the figures, FIG. 1 is a block diagram illustrating an arrangement of the system components for performing the method of the present invention. An AC customer load 10 is connected to a utility 12. The utility 12 provides AC power to a rectifier 14. A DC link 16, which comprises a capacitor bank, for example, is connected between the rectifier 14 and a DC to AC inverter 18. The inverter 18 is a device that takes a DC voltage input and provides an AC voltage output. Examples of typical inverters include motor drives and UPS systems, etc. The inverter 18 provides AC power to the AC load 10.

In addition, an energy storage or supply system 20, for example, a magnet discharge system, is connected to a DC to DC converter 22. The converter 22 typically remains in a standby condition until the utility 12 fails, then the converter 22 starts operating to deliver energy to the customer AC load 10 via the DC link 16 and inverter 18. The converter 22 gathers information while watching a failure of the utility 12 develop so that when the converter 22 turns on, it knows at what level to operate. For example, as the utility 12 begins to fail, the voltage of the DC link 16 begins to fall proportionately. In particular, the converter 22 measures the DC link voltage and determines when it reaches a predetermined level. The predetermined level is set to ensure that a legitimate sag of power is experienced and needs to be corrected by the converter 22 and not just an occurrence of a false power drop. The converter 22 gathers the voltage information as the voltage of the DC link 16 is falling to estimate the load.

It is desired that the method used to estimate $dV_{DC\ link}/dt$ be tolerant of noise that could be present on the DC link 16 or feedback signal. For this reason, a simple differentiating circuit is not preferred since differentiation circuits, by definition, amplify high frequency noise.

Instead, a number of voltage readings are taken over a period of time. The sampled data points may be represented as coordinates in a two-dimensional Cartesian space, $\{(x_1, y_1), (x_2, y_2), (x_3, y_3) \ldots \}$. In this case, the x-axis is time and the y-axis is DC link voltage.

Assuming that during the time spanned by the sample points the load current is constant, the trajectory of the DC link voltage is best approximated by a straight line, $V_{DC\ link}(t) = mt + b$ wherein m is the slope of the line. A curve-fitting algorithm is used to determine the coefficients, m and b, which describe the best straight line that can be drawn through the sampled data points. Applying such an algorithm minimizes the effects of noise appearing on the feedback signal or the DC link 16.

A common algorithm, the method of least squares, minimizes the sum of the squared error from the data points to the best fit curve. Applying this method to a linear curve fit yields the following two equations:

$$bn + m\ \Sigma x_j = \Sigma y_j$$

$$b\ \Sigma x_j + m\ \Sigma x_j^2 = \Sigma x_j y_j;$$

where n is the number of sampled points, m is the slope of the line and the summations are taken from j=1 to n. By taking n samples, uniformly separated in time by $T_0$ seconds and starting at t=0, the x coordinates become $\{0, T_0, 2T_0 \ldots (n-1)T_0\}$. The corresponding y coordinates, or DC link voltages, are therefore $\{V_{DC\ link}(0), V_{DC\ link}(T_0), V_{DC\ link}(2T_0) \ldots V_{DC\ link}((n-1)T_0)\}$.

Solving this system of equations for the slope m, yields an expression which estimates the rate at which the voltage of the DC link is falling. As mentioned above, this slope ($dV_{DC\ link}/dt$) is directly proportional to the average current being drawn by the inverter 18, namely $I_{load} = C_{DC\ link}(dV_{DC\ link}/dt)$. If n is chosen to be an even number, this may be shown to have the form:

$$I_{Load\ Ave.} = C_1\{V_{DC\ link}((n-1)T_0) - V_{DC\ link}(0)\} + C_2\{V_{DC\ link}((n-2)T_0) - V_{DC\ link}(T_0)\} + C_3\{V_{DC\ link}((n-3)T_0) - V_{DC\ link}(2T_0)\} + \ldots + C_{n/2}\{V_{DC\ link}(nT_0/2) - V_{DC\ link}(nT_0/2 - 1)\},$$

where $C_1 \ldots C_{n/2}$ are constants.

If n is chosen to be an odd number, the middle sample coefficient is zero and therefore does not contribute to the slope estimate. For a six sample approximator (n=6) this reduces to:

$$I_{Load\ Ave.} = C_1\{V_{DC\ link}(5T_0) - V_{DC\ link}(0)\} + C_2\{V_{DC\ link}(4T_0) - V_{DC\ link}(T_0)\} + C_3\{V_{DC\ link}(3T_0) - V_{DC\ link}(2T_0)\}$$

Such an equation has the form of a simple finite impulse response (FIR) filter. Such a filter may be implemented in many ways, using either digital or analog circuitry. Samples are taken continuously, and as the time window spanned by the data samples passes through time, new samples are shifted in and the oldest samples are discarded in a first in, first out fashion. By continually updating the samples as time passes, the load estimator applies a "flying" curve fit to the points in the sample window and returns the slope of the best straight line which can be drawn between them.

FIG. 2A is a block diagram of a six sample load estimator referenced generally at 30. The load estimator 30 comprises 12 sample and hold amplifiers, individually numbered 1–12. Each sample and hold amplifier is connected to a clock signal. In particular, odd-numbered amplifiers illustrated in FIG. 2A are connected to Clock 1 in FIG. 2B and even-numbered amplifiers are connected to Clock 2 in FIG. 2B. FIG. 2B illustrates respective timing diagrams for Clocks 1 and 2.

Each amplifier also has an input signal and an output signal. As shown in FIG. 2A, the input signal for sample and hold amplifier 1 is the voltage potential of the DC link 16. The output signal for amplifier 1 is connected to the input of amplifier 2. Similarly, the output signal of each successive amplifier is connected to the input of the following amplifier. The output of each even-numbered sample and hold amplifier (i.e., amplifiers 2, 4, 6 . . . ) is connected to a difference amplifier or summer junction, for example, summers 34, 36 and 38 shown in FIG. 2A. The output of each summer 34, 36, 38 is respectively connected to a constant multiplier C1, C2, C3 to provide a scaled output. The scaled outputs are then summed at a further summer 40 to provide an output 44. The output 44 is then provided as an initial condition to the converter 22 (see FIG. 1).

The time that the voltage of the DC link 16 is actually allowed to fall may be a relatively short period of time, depending on the DC link capacitance and the load applied. For this reason, a digital implementation may not be as desirable as an analog one.

As described above, the load estimator equation consists of terms which are the difference between two samples multiplied by a constant gain. These terms are then summed together to form the output. Given analog representation of these time-delayed samples, such an equation can be easily implemented in hardware with difference amplifiers 34, 36, 38 and operational amplifier summer 40 as indicated in FIG. 2A. In order to create the string of time-delayed samples to be used as the input to the equation, $2n$ sample and hold amplifiers (i.e., the 12 amplifiers in the six sample load estimator example of FIG. 2A) may be cascaded in series. As shown in FIG. 2A, this forms a "bucket brigade" of time-shifted analog voltages. A description of the operation of FIGS. 2A and 2B in accordance with the method of the present invention follows.

During the time that the "sample" input is high, each sample and hold amplifier captures the potential present on its input and tracks this voltage on its output. When the "sample" input goes low, the voltage present on its output at that moment is frozen regardless of input changes. Again referring to the arrangement and timing diagrams of FIGS. 2A and 2B, suppose that at time=0, Clock 1 and Clock 2 are both low. Also assume that some voltage, $V_A$ and $V_C$ is present on points A and C, respectively. When Clock 1 goes high, point B changes to be equal to $V_A$ (via sample and hold number 3), and point D changes to be equal to $V_C$ (via sample and hold number 5). Because Clock 2 is still low, points A and C remain unchanged. However, at time $T_1$, Clock 1 goes low, and all voltages are now frozen until Clock 2 goes high at time $T_2$. At this point, $V_C$ is transferred to point E (via sample and hold number 6), and point C transitions to $V_A$(via sample and hold number 4). At $T_3$, Clock 2 again goes low, and all voltages are frozen. The end result of this cycle is that $V_A$ has been shifted from point A to point C, and $V_C$ has been shifted from point C to point E. In the meantime, a new sample has been taken from the input signal and stored at point A. This cycle repeats every $T_0$ seconds to form a string of time-delayed analog samples. The appropriate points in the string are then fed into the respective difference amplifier 34, 36, 38 as inputs as discussed above. This circuitry is very fast and demands no software overhead. It may also be implemented using relatively inexpensive and readily available analog components.

Figure 3A:
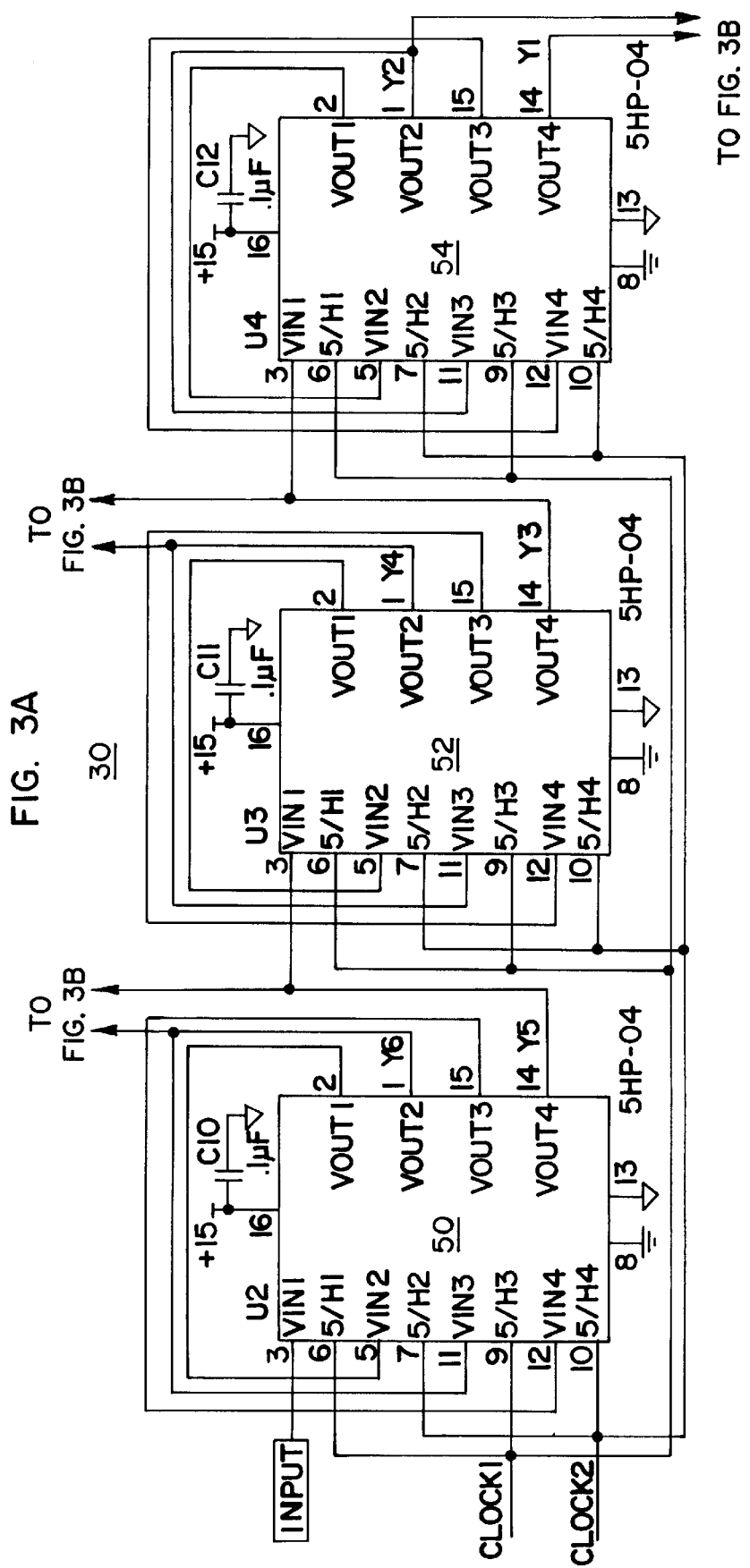
FIGS. 3A and 3B together show is a schematic diagram illustrating an embodiment of an electrical circuit for use in accordance with an embodiment of the method of the present invention.
Figure 3B:
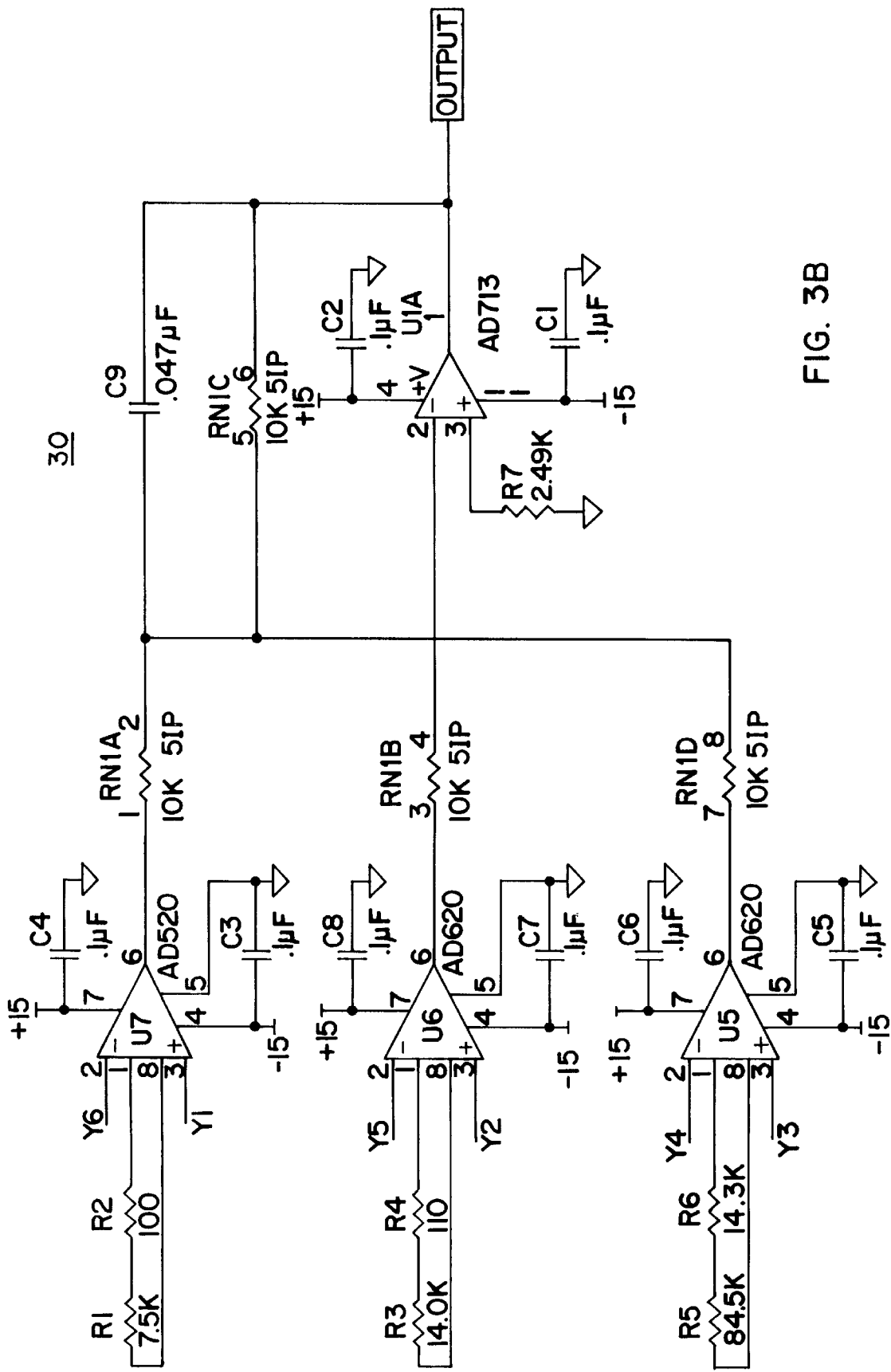

As an example, FIGS. 3A and 3B is a circuit diagram illustrating a preferred implementation of an electrical circuit of the six sample load estimator of FIGS. 2A and 2B. As shown in FIGS. 2A and 2B, the Clock 1 and Clock 2 inputs are provided, as well as inputs to each of the sample and hold amplifiers. The 12 sample and hold amplifiers of FIG. 2A are embodied as four amplifiers on each of three IC chips 50, 52, 54 in FIGS. 3A and 3B. The circuit of FIGS. 3A and 3B operates similarly to FIGS. 2A and 2B.

Although the present invention has been described in substantial detail with reference to one or more specific embodiments, those of skill in the art will recognize that changes may be made thereto without departing from the scope and spirit of the invention as set forth in the appended claims.

I claim:

1. A method of delivering an optimized power level output from a backup energy system to a load connected to a primary energy supply via a DC link and an inverter, the method comprising the steps of:

sensing a voltage of the DC link connected to the load;

connecting a converter between the backup energy supply and the DC link;

evaluating a rate of change of the voltage of the DC link;

determining an estimate of the average load current using the rate of change of the DC link voltage; and controlling the converter using the average load current to deliver an optimized power level output from the backup energy supply to the load.

2. The method of claim 1 further comprising the step of:

setting an initial condition to control the converter so that when the converter switches on to deliver energy to the load, the initial condition sets pulse widths of switching elements in the converter.

3. The method of claim 1 further comprising the step of:

allowing the voltage of the DC link to f all to a predetermined level before controlling the converter.

4. The method of claim 1 wherein the step of determining an estimate of the average load current using the rate of change of the DC link voltage is performed in accordance with a formula $I_{load}=C_{DC\ link}(dV_{Dc\ link}/dt)$.

5. The method of claim 1 wherein the step of evaluating a rate of change of the DC link voltage is performed by representing a plurality of DC link voltage samples taken over time as points in an x-y coordinate system and employing a curve-fitting algorithm to generate a best fit line such that the slope of the line represents the rate of change of the voltage of the DC link.

6. The method of claim 5 further comprising the step of:

implementing the step of evaluating the rate of change of the DC link voltage using a first plurality of serially connected sample and hold amplifiers having a second plurality of difference amplifiers selectively connected to the first plurality of sample and hold amplifiers and an operational amplifier summer connected to sum outputs of the difference amplifiers to produce an output.

7. The method of claim 6 wherein the output of the operational amplifier summer is an estimate of the load.

8. The method of claim 6 wherein the output of the operational amplifier summer is an initial condition for controlling the converter.

9. The method of claim 1 further comprising the steps of:
providing closed loop voltage control for the converter;
using the estimate of the average load current as a feedback signal for the closed loop voltage control.

10. The method of claim 1 wherein the DC link comprises a capacitor bank.

11. A method of estimating an electrical load on an inverter system having a DC link, the method comprising the steps of:
sensing a voltage of the DC link;
evaluating a rate of change of the DC link voltage; and
calculating an estimate of an average load current, using the rate of change of the DC link voltage.

12. The method of claim 11 wherein the DC link comprises a capacitor bank.

13. The method of claim 11 further comprising the step of providing a converter connected to the inverter system.

14. The method of claim 11 wherein the step of calculating an estimate of the average load current using the rate of change of the DC link voltage is performed in accordance with a formula $I_{load} = C_{DC\ link}(dV_{DC\ link}/dt)$.

15. A method of estimating an electrical load on an inverter system having a DC link and a converter system, the method comprising the steps of:
sensing a voltage of the DC link;
evaluating a rate of change of the DC link voltage; and
calculating an estimate of an average load current, using the rate of change of the DC link voltage.

16. The method of claim 15 further comprising the steps of:
providing closed loop voltage control for the converter system; and
using the estimate of the average load current as a feedback signal for the closed loop voltage control.

* * * * *